United States Patent
Dao et al.

(10) Patent No.: US 11,996,446 B2
(45) Date of Patent: May 28, 2024

(54) ELASTIC STRAIN ENGINEERING OF DEFECT DOPED MATERIALS

(71) Applicants: Massachusetts Institute of Technology, Cambridge, MA (US); Nanyang Technological University, Singapore (SG)

(72) Inventors: Ming Dao, West Roxbury, MA (US); Ju Li, Weston, MA (US); Zhe Shi, Cambridge, MA (US); Subra Suresh, Singapore (SG)

(73) Assignees: Massachusetts Institute of Technology, Cambridge, MA (US); Nanyang Technological University, Singapore (SG)

( * ) Notice: Subject to any disclaimer, the term of this patent is extended or adjusted under 35 U.S.C. 154(b) by 333 days.

(21) Appl. No.: 17/400,097

(22) Filed: Aug. 11, 2021

(65) Prior Publication Data
US 2022/0037469 A1 Feb. 3, 2022

Related U.S. Application Data

(62) Division of application No. 16/585,308, filed on Sep. 27, 2019, now Pat. No. 11,121,219.

(60) Provisional application No. 62/744,836, filed on Oct. 12, 2018.

(51) Int. Cl.
*H01L 29/10* (2006.01)
*B81B 7/00* (2006.01)
*H01L 21/02* (2006.01)
*H10N 30/88* (2023.01)

(52) U.S. Cl.
CPC ......... *H01L 29/1054* (2013.01); *B81B 7/008* (2013.01); *H01L 21/02664* (2013.01); *H10N 30/886* (2023.02)

(58) Field of Classification Search
CPC ................................................. H01L 21/02664
See application file for complete search history.

(56) References Cited

U.S. PATENT DOCUMENTS

| | | | |
|---|---|---|---|
| 6,652,968 B1 * | 11/2003 | Miller | H01B 1/22 428/407 |
| 11,121,219 B2 | 9/2021 | Dao et al. | |
| 2012/0074385 A1 | 3/2012 | Tak | |
| 2012/0112152 A1 * | 5/2012 | Bulovic | H01L 29/84 257/E21.52 |

(Continued)

FOREIGN PATENT DOCUMENTS

| EP | 2637010 A1 | 9/2013 |
|---|---|---|
| EP | 2648138 A1 | 10/2013 |

(Continued)

OTHER PUBLICATIONS

International Search Report and Written Opinion for Application No. PCT/US2019/053368 dated Dec. 11, 2019.

(Continued)

*Primary Examiner* — Jay C Chang
*Assistant Examiner* — Mikka Liu
(74) *Attorney, Agent, or Firm* — Wolf, Greenfield & Sacks, P.C.

(57) ABSTRACT

Compositions and methods related to straining defect doped materials as well as their methods of use in electrical circuits are generally described.

20 Claims, 7 Drawing Sheets

(56) References Cited

U.S. PATENT DOCUMENTS

2013/0333755 A1  12/2013  Lunt
2014/0017839 A1   1/2014  Li et al.
2014/0323968 A1  10/2014  Rogers et al.
2016/0322568 A1  11/2016  Fadhel et al.

FOREIGN PATENT DOCUMENTS

JP  2016-528712 A    9/2016
JP  2017-502518 A    1/2017
WO  2012/054041 A1   4/2012
WO  2014/169218 A2  10/2014
WO  2015/097232 A1   7/2015
WO  2022/046896 A1   3/2022

OTHER PUBLICATIONS

International Preliminary Report on Patentability for Application No. PCT/US2019/053368 dated Apr. 22, 2021.
Extended European Search Report dated Jun. 27, 2022, for Application No. EP19870427.2.
Japanese Notice of Reasons for Rejection dated Nov. 27, 2023, for Application No. JP2021-519880.
Germanenko et al., Acceptor energy and characteristics of the Mott transition in p-type InSb subjected to uniaxial deformation. Sov. Phys. Semicond. 1987. 21(11): 1216-20.
Limelette et al., Universality and critical behavior at the Mott transition. Science. Oct. 3, 2003;302(5642):89-92.
Shi et al., Deep elastic strain engineering of bandgap through machine learning. Proc Natl Acad Sci U S A. Mar. 5, 2019;116(10):4117-4122. doi: 10.1073/pnas.1818555116. Epub Feb. 15, 2019. Erratum in: Proc Natl Acad Sci U S A. Mar. 17, 2020;117(11):6274.

* cited by examiner

ELASTIC STRAIN ENGINEERING OF DEFECT DOPED MATERIALS

RELATED APPLICATIONS

This application is a divisional of U.S. application Ser. No. 16/585,308, filed Sep. 27, 2019, which claims benefit under 35 U.S.C. § 119(e) of U.S. Provisional Application Ser. No. 62/744,836, filed Oct. 12, 2018, each of which is incorporated herein by reference in its entirety for all purposes.

GOVERNMENT SPONSORSHIP

This invention was made with Government support under N00014-17-1-2661 awarded by the Office of Naval Research. The Government has certain rights in this invention.

TECHNICAL FIELD

Compositions and methods related to elastic strain engineering of defect doped materials are generally described.

BACKGROUND

A material with an electronic bandgap much greater than its thermal fluctuation energy will often not have enough charge carriers (e.g., electrons and/or holes) to function as a semiconducting material. Instead, to function, the material may include defects with additional localized electronic states whose energies are inside the electronic bandgap of the material, but proximate to the edges of the conduction band minimum and/or the valence band maximum. If the energy-difference between the localized electronic states of the defect and either the conduction band minimum or the valence band maximum is sufficiently small, then it is possible for the defects to be ionized by thermal fluctuation energy. In such cases, a localized electron around the defect either: (i) makes a transition from the aforementioned localized electronic state to the delocalized conduction band state (n-doping); or (ii) captures a delocalized valence band electron and becomes the localized electronic state, thereby creating a delocalized hole in the valence band (p-doping). When the energy difference is large, however, thermal fluctuation energy at room temperature may not be sufficient to ionize a defect to form charge carriers.

SUMMARY

Compositions and methods related to elastically straining defect doped materials are generally described.

In certain embodiments, a composition includes a defect doped material, wherein a strain is applied to a least a portion of the defect doped material. The defect doped material may be a non-conducting material when the defect doped material is in an unstrained state, and the defect doped material may be a semiconducting material or a conducting material when the strain is applied to the defect doped material.

According to some embodiments, a method includes controlling a conductive state of a defect doped material. The method may include applying a strain to at least a portion of the defect doped material, and transitioning the defect doped material from a non-conductive material to a semiconducting material or a conducting material.

In certain embodiments, an electrical circuit may include a defect doped material forming at least a portion of the electrical circuit, and an actuator configured to selectively strain the defect doped material. The defect doped material may be a non-conducting material when the defect doped material is in an unstrained state, and the defect doped material may be a semiconducting material or a conducting material when the defect doped material is selectively strained by the actuator.

It should be appreciated that the foregoing concepts, and additional concepts discussed below, may be arranged in any suitable combination, as the present disclosure is not limited in this respect. Further, other advantages and novel features of the present disclosure will become apparent from the following detailed description of various non-limiting embodiments when considered in conjunction with the accompanying figures.

BRIEF DESCRIPTION OF DRAWINGS

The accompanying drawings are not intended to be drawn to scale. In the drawings, each identical or nearly identical component that is illustrated in various figures may be represented by a like numeral. For purposes of clarity, not even component may be labeled in even drawing. In the drawings.

DETAILED DESCRIPTION

Figure 1A:
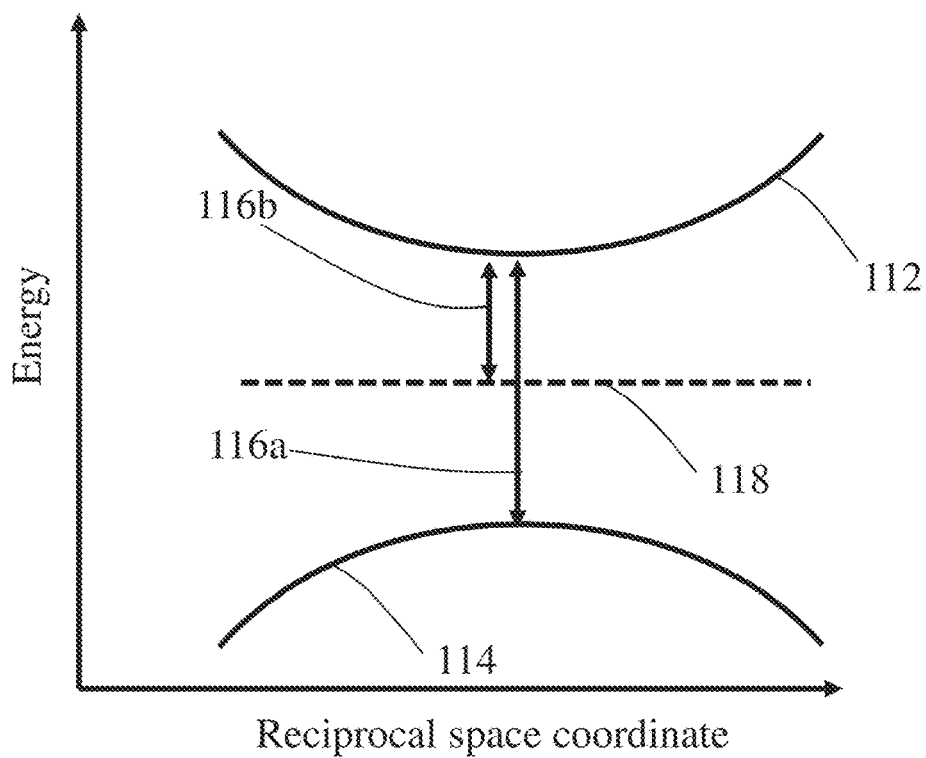
FIG. 1A is, according to some embodiments, a schematic representation of a conventional change in energy difference between a localized electronic state of a defect and an excited electronic state of a defect.

Materials with a wide bandgap often do not have enough charge carries (e.g., holes and/or electrons) in order to function as semiconducting or conducting materials. For example, the implementation of diamond, an ultra-wide bandgap material, as a semiconducting or conducting material has conventionally been unsuccessful due to the difficulty in effectively doping the material with a defect capable of producing electrons (e.g., a n-type dopant). In some materials, a substitutional defect in the material may spontaneously break symmetry from one or more localized electronic states to one or more non-degenerate low-symmetry variant electronic states. Such a spontaneous break in symmetry results in a material with a deep dopant state that has an energy far below (e.g., greater than or equal to 1 eV below) the conduction band edge or above the valence band edge. The energy of activation to ionize a defect in a deep dopant state is too large to be facilitated by room-temperature thermal fluctuations. Furthermore, depending on the choice of defect, the energy of activation of the defect to overcome the energy gap from the one or more localized electronic states to either the conduction band edge or the valence band edge can vary greatly within the same material. In a material comprising diamond, for instance, the energy of activation of a p-type dopant can differ by approximately 200 meV from the energy of activation of an n-type dopant. As a result, a defect in a deep dopant state typically does not contribute charge carriers to the conduction band and/or valence band, resulting in a material that is incapable of being used in a semiconducting or conducting device. Thus, the Inventors have recognized a need for methods and systems to further alter the properties of wide bandgap materials to facilitate their use in a semiconducting and/or conducting device.

In view of the above, the Inventors have realized and appreciated that elastic strain can be used to control the doping level in a defect doped material. In certain embodiments, a defect may transition from a deep dopant state to a shallow dopant state upon the application of an elastic strain. For example, as strain is applied to the defect doped material, the transition of a defect from a deep dopant state to a shallow dopant state may occur due to a decrease in the energy of activation to ionize a defect to form a plurality of charge carriers. Further, in some embodiments, the application of elastic strain may be used to dynamically toggle the defect between a shallow dopant state and a deep dopant state rapidly and/or reversibly, akin to an "on-off" switch. Resultantly, in certain embodiments, a non-conducting defect doped material with a large activation energy may transition to a semiconducting material or a conducting material with a lower activation energy to ionize the defects upon the application of an elastic strain. Furthermore, the compositions and methods described herein can be used to effectively n-dope and/or p-dope a material that was previously considered to be "undopable," such that the material defects may transition from a deep dopant state to a previously inaccessible shallow dopant state upon the application of elastic strain. In addition to semiconducting and/or conducting devices, the defect doped materials may be implemented in a memory device, due to the ability to dynamically toggle the defect doped material between these states.

In a conventional defect doped material, the ionization of defects leads to the formation of one or more charge carriers (e.g., electrons and/or holes). For example, in some cases, a defect may have one or more localized electronic states that are within a bandgap and proximate to the conduction band minimum and/or valence band maximum. The smaller the energy gap between the localized electronic states and the conduction band minimum and/or valence band maximum, the less energy is used to ionize the defects by thermal fluctuation energy at room temperature. FIG. 1A presents a schematic representation of a band structure of a defect doped material including a bandgap between a conduction band 112 and valence band 114 with a bandgap energy 116a. As shown in the figure, a defect may have electronic state 118 within the bandgap and a corresponding activation energy 116a to reach the conduction band edge and/or valence band edge 112. In certain embodiments, the activation energy may be too large to ionize the defect from the localized electronic state 114 to the conduction band edge and/or valence band edge 112 by thermal fluctuation energy at room temperature.

Figure 1B:
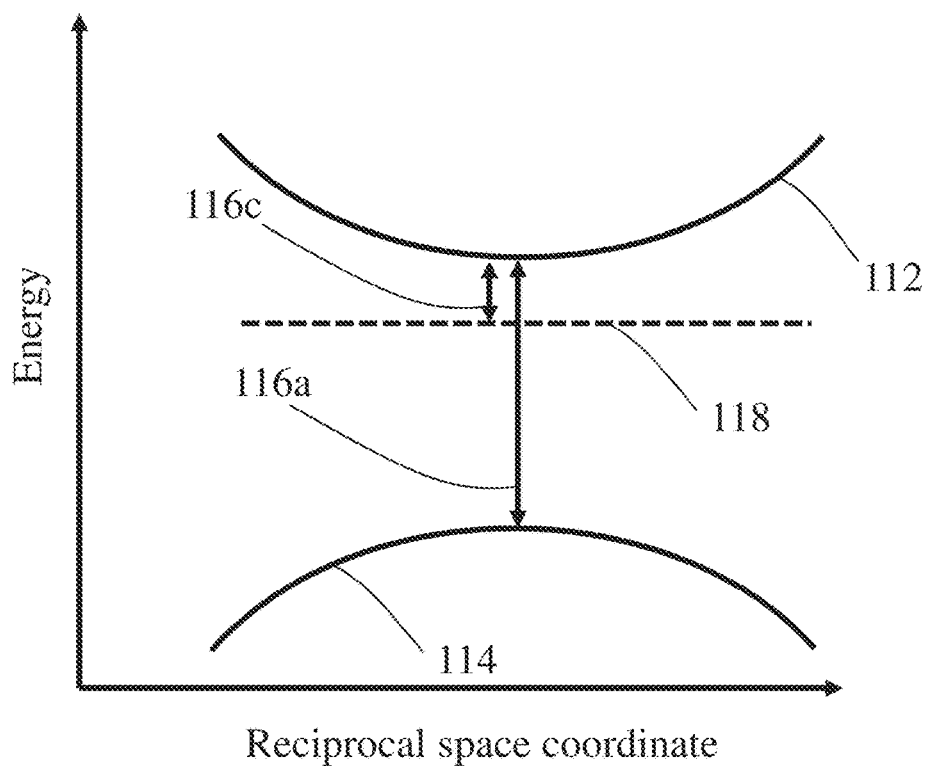
FIG. 1B is, according to some embodiments, a schematic representation of a change in energy difference between a localized electronic state of a defect and an excited electronic state of a defect due to the application of strain.

FIG. 1B represents how applying an elastic strain to the material may either shift the band structure and/or the energy states of the material defects. For example, the electronic state 118 of the defects may move towards the conduction band 112 of the band structure shown in FIG. 1A. Correspondingly, the resulting activation energy 116c to ionize the defects relative to the conduction band has been reduced by the applied elastic strain. Of course embodiments, in which one or more of the conduction band, valence band, and/or energy state of the defects change relative spacing, change shape, and/or change corresponding maxima and minima to reduce an associated activation energy to ionize the defects are also contemplated. Thus, in some embodiments, the application of an elastic strain to a material may cause a defect in a material to transition into an excited electronic state (e.g., shallow dopant state) such that the activation energy to ionize the defect to a conduction band edge and/or valence band edge is less than an activation energy of the defect in the unstrained state. Accordingly, the conducting state of a defect doped material can be controlled by the application of strain to the defect doped material, such that the defect doped material may transition from a non-conducting material to a semiconducting material or a conducting material upon the application of strain due to the decrease in the activation energy used to ionize the defects.

It should be understood that the disclosed methods of applying an elastic strain to alter the doping state of a defect doped material may be applied to any of a variety of suitable compositions. For example, in certain embodiments the defect doped material may comprise defect doped diamond (e.g., carbon diamond), gallium oxide ($Ga_2O_3$), gallium nitride (GaN), boron nitride (BN), and/or any other appropriate material. In certain embodiments, the defect doped material may be crystalline. In other embodiments, the defect doped material may be at least partially amorphous. Additionally, appropriate dopants may include, but are not limited to, nitrogen, boron, phosphorus, and/or combinations thereof. In a certain non-limiting embodiment, a material comprising diamond is defect doped with nitrogen. In such an embodiment, the diamond may comprise about 1% nitrogen heteroatoms replacing carbon atoms.

According to certain embodiments, the amount of elastic strain that is applied to a defect doped material to transition the material into a desired conductive state may be any of a variety of suitable amounts. In certain embodiments, a strain is applied to a defect doped material in an amount between or equal to 1% and 25%. For example, in some embodiments, the elastic strain applied to the defect doped material may be greater than or equal to 0.5%, 1%, 5%, 10%, 15%, and/or any other appropriate amount of strain. In certain embodiments, the elastic strain may be applied to the defect doped material in an amount less than or equal to 25%, 20%, 15%, 10%, 5%, 1%, and/or any other appropriate amount of strain. Combinations of the above recited ranges are also possible (e.g., the elastic strain may be applied to the defect doped material in an amount between or equal to 1% and 25%, 1% and 15%, 5% and 10%, and/or any other appropriate range including ranges both greater than and less than those noted above. It should be understood that these elastic strain ranges may correspond to either compressive strains, tensile strains, shear strains, and/or combinations of the forgoing such that uniaxial, biaxial, and/or three dimensional elastic strains may be applied to the disclosed materials. A variety of suitable methods of applying strain are further described in detail below.

The above noted strain ranges applied to a material may be measured and/or calculated in a number of ways. For example, the elastic strains present in a material may be determined using finite element analysis, strain calculations using material geometries and applied deformations, strain calculations made using lattice mismatch considerations, strain calculations made using molecular dynamics simulations, strain calculations made by first-principles density functional theory simulations, and/or any other appropriate method as the disclosure is not limited to any particular method for evaluating the applied elastic strains.

Figure 2:
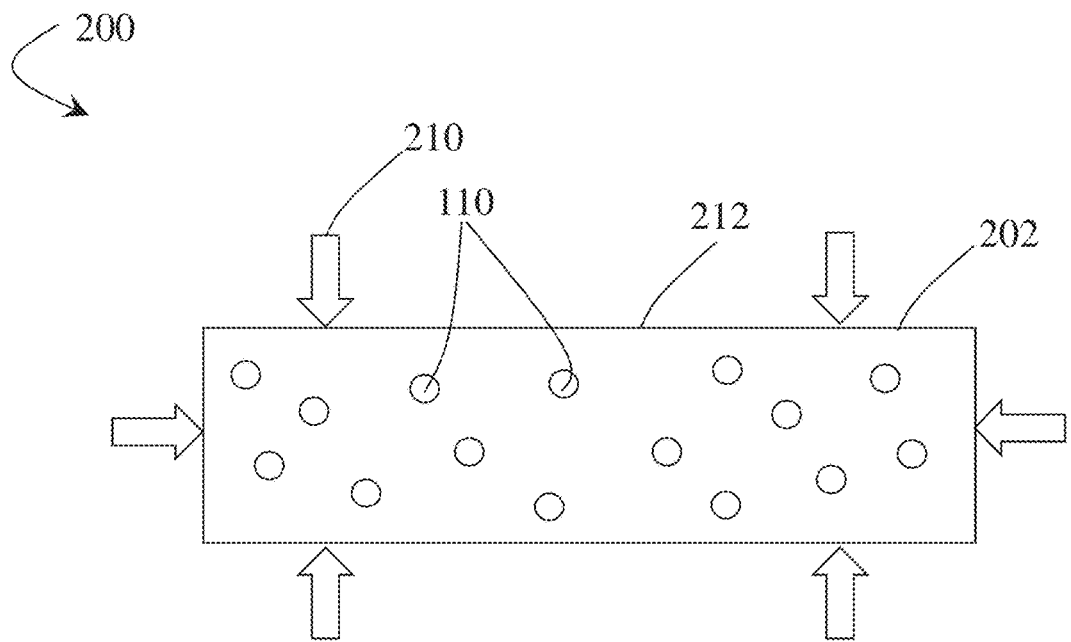
FIG. 2 is, according to some embodiments, a cross-sectional schematic representation of a non-limiting defect doped material.

In certain aspects, a material may comprise a defect (e.g., a dopant). The defect may have the ability to be ionized into a charge carrier, such as an electron or a hole. For example, as shown in FIG. 2, a composition 200 may correspond to a defect doped material 202 that comprises a defect 110 (e.g., a plurality of defects). The defects may be introduced into the material by methods understood by one of ordinary skill in the art. For instance, the defects may be implanted and/or grown in the material during deposition of the material and/or the defects may be formed after deposition of the material using conventional techniques. Possible methods include molecular beam epitaxy, chemical vapor deposition, and/or other appropriate techniques. The defects may be evenly dispersed throughout the defect doped material in some embodiments. However, in other embodiments, the defect doped material may comprise defects unevenly dispersed throughout the defect doped material. For example, in some embodiments the defects may only be present in one or more isolated regions of the defect doped material.

In some embodiments, it may be desirable for a defect doped material to comprise negative charge carriers (e.g., electrons) and/or positive charge carriers (e.g., holes) depending on the functionality of the defect doped material and/or what application it will be implemented in. Accordingly, a defect doped material may comprise a p-type dopant and/or an n-type dopant.

A defect doped material may comprise defects in any of a variety of suitable concentrations. The concentration of defects in the defect doped material may depend on the material chosen (e.g., diamond, $Ga_2O_3$, BN, and the like). In certain embodiments, the defect doped material comprises defects in a concentration of less than or equal to $10^{30}$ cm$^{-3}$, less than or equal to $10^{25}$ cm$^{-3}$, less than or equal to $10^{20}$ cm$^{-3}$, less than or equal to $10^{15}$ cm$^{-3}$, or less than or equal to $10^{10}$ cm$^{-3}$, or less than or equal to $10^{5}$ cm$^{-3}$. In some embodiments, the defect doped material comprises the defect in a concentration of greater than or equal to $10^{5}$ cm$^{-3}$, greater than or equal to $10^{10}$ cm$^{-3}$, greater than or equal to $10^{15}$ cm$^{-3}$, greater than or equal to $10^{20}$ cm$^{-3}$, or greater than or equal to $10^{25}$ cm$^{-3}$. Combinations of the above recited ranges are also possible (e.g., the defect doped material comprises defects in a concentration of less than or equal to $10^{30}$ cm$^{-3}$ and greater than or equal to $10^{5}$ cm$^{-3}$, the defect doped material comprises defects in a concentration of less than or equal to $10^{25}$ cm$^{-3}$ and greater than or equal to $10^{15}$ cm$^{-3}$). The concentration of the defects can be measured, in some embodiments, using experimental methods such as X-ray photoelectron spectroscopy (XPS).

As described above, an activation energy may be associated with ionizing defects to form a plurality of charge carriers, such as electrons and/or holes. According to some embodiments, the activation energy to ionize the defects is an energy gap between one or more electronic states of the defect and the conduction band edge and/or valence band edge. In certain instances, when the defect doped material is in an unstrained state, the activation energy of a defect may be sufficiently large such that it will not be ionized by thermal fluctuations of the material at ordinary operating temperatures. In certain embodiments, such a large activation energy results in a defect doped material that is non-conducting due to the large energy differential between the one or more electronic states of the defect and either of the band edges.

In some embodiments, the activation energy to ionize a defect of a defect doped material to form a plurality of charge carriers is greater than or equal to 1,000 meV when the defect doped material is in an unstrained state. For example, in some embodiments, the activation energy to ionize the defect is greater than or equal to 1,100 meV, greater than or equal to 1,200 meV, greater than or equal to 1,300 meV, greater than or equal to 1,400 meV, or greater than or equal to 1,500 meV when the defect doped material is in an unstrained state. In certain embodiments, the activation energy to ionize the defect is less than or equal to 2,000 meV, less than or equal to 1,500 meV, less than or equal to 1,400 meV, less than or equal to 1,300 meV, less than or equal to 1,200 meV, or less than or equal to 1,100 meV when the defect doped material is in an unstrained state. Combinations of the above recited ranges are also possible (e.g., the activation energy to ionize the defect may be greater than or equal to 1,000 meV and less than or equal to 2,000 meV when the defect doped material is in an unstrained state, the activation energy to ionize the defect may be greater than or equal to 1,200 meV and less than or equal to 1,800 meV when the defect doped material is in an unstrained state). Of course defect energies in the unstrained state both greater and less than those noted above are also contemplated.

In some embodiments, the activation energy to ionize defects of a defect doped material to form a plurality of charge carriers is less than or equal to 200 meV when the defect doped material is in an elastically strained state. For example, in certain embodiments, the activation energy to ionize the defect is less than or equal to 150 meV, less than or equal to 100 meV, or less than or equal to 50 meV when the defect doped material is in a strained state. In some embodiments, the activation energy to ionize the defect is greater than or equal to 1 meV, greater than or equal to 50 meV, greater than or equal to 100 meV, or greater than or equal to 150 meV when the material is in a strained state. Combinations of the above recited ranges are also possible (e.g., the activation energy to ionize the defect may be less than or equal to 200 meV and greater than or equal to 1 meV when the defect doped material is in a strained stale, the activation energy required to ionize the defect may be less than or equal to 150 meV and greater than or equal to 100 meV when the defect doped material is in a strained state). Of course embodiments in which the activation energy is either greater than or less than the range of activation energies noted above for a strained defect doped material are also contemplated as the disclosure is not so limited.

Figure 7:
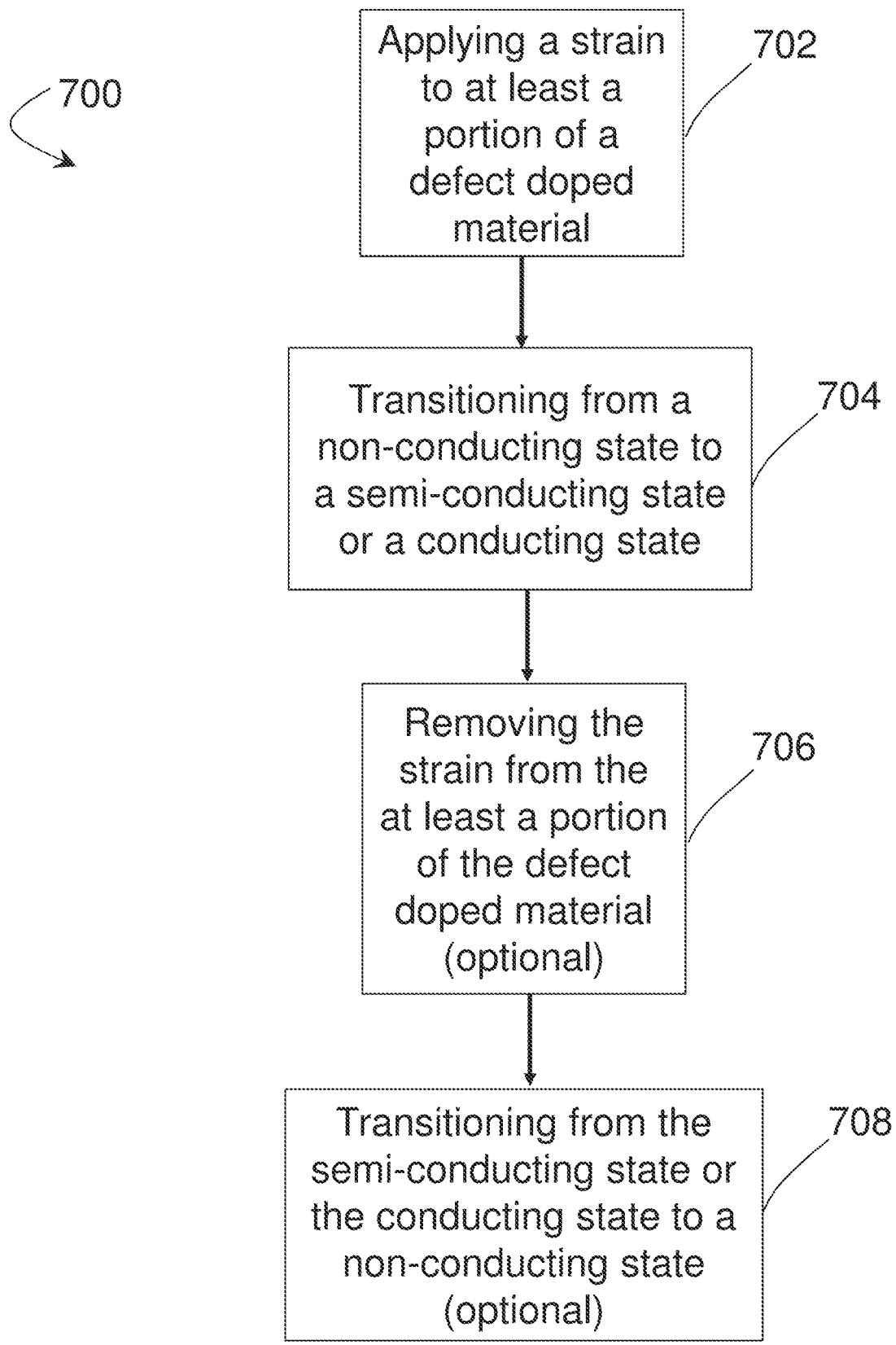
FIG. 7 is, according to some embodiments, a flow chart describing a method of controlling a conductive state of a defect doped material.

Certain embodiments described herein may be related to a method of controlling a conductive state of a defect doped material. The conductive state of a defect doped material may be controlled, in some embodiments, by applying strain to at least a portion of the defect doped material. FIG. 7 is, according to some embodiments, a flow chart describing a method of controlling a conductive state of a defect doped material. As shown in FIG. 7, a method of controlling a conductive state of a defect doped material 700 may include step 702 comprising applying a strain to at least a portion of a defect doped material. As a result, in some aspects, a corresponding composition may comprise a defect doped material with a strain applied to at least a portion of the defect doped material. According to some embodiments, the strain may be an elastic strain.

As a result of applying strain to the defect doped material, the defect doped material may transition from a non-conducting material to a semiconducting material or a conducting material. For example, as shown in FIG. 7, method 700 comprises step 704 where the defect doped material transitions from a non-conducting material to a semiconducting material or a conducting material. Transitioning from a non-conductive material to a semiconducting material or a conducting material may comprise decreasing the activation energy to ionize the doped defects to form a plurality of charge carriers. Upon applying the strain to the defect doped material, for example, the activation energy to ionize defects of the defect doped material to form a plurality of charge carriers may decrease from a larger first energy (e.g., greater than or equal to 1,000 meV) to a smaller second energy (e.g., less than or equal to 200 meV).

Depending on the application of the defect doped material, it may be desirable to selectively transition the material from the semiconducting material or the conducting material back to a non-conducting material. Accordingly, in some embodiments, a strain may be removed from at least a portion of an elastically strained defect doped material. For example, in certain embodiments, the defect doped material may be implemented in a semiconducting or conducting device where it is desirable to return to a deep dopant state from a shallow dopant state to change from a semiconducting material or a conductive material to a non-conductive material. This may have applications for switching, memory, or other appropriate processes. In either case, the conductive state of a defect doped material may be controlled, in some embodiments, by removing a previously applied elastic strain from at least a portion of the defect doped material as shown in FIG. 7 at step 706. As a result, in some aspects, a composition associated with the disclosed methods and systems may comprise a defect doped material where at least a portion of the defect doped material is in an unstrained state during at least one mode of operation. For example, as shown at step 708, the defect doped material may transition from the semiconducting material or the conducting material to the non-conductive material. Transitioning from the semiconducting material or conducting material may correspond to increasing the activation energy to ionize a defect to form a plurality of charge carriers. Upon removing the strain from the defect doped material, for example, the activation energy to ionize defects of the defect doped material to form a plurality of charge carriers may increase from a smaller energy (e.g., a shallow dopant state that is less than or equal to 200 meV) to a larger energy (e.g., a deep dopant state that is greater than or equal to 1,000 meV). Accordingly, the conducting state of a defect doped material may be selectively controlled by the selective removal and application of elastic strain to a defect doped material, such that the defect doped material may selectively transition between a semiconducting material or a conducting material and a non-conducting material.

As noted above, in some embodiments, it may be advantageous, to cyclically apply and remove strain to a defect doped material to selectively control a conducting state of the defect doped material. The cyclic application and removal of strain to control a conducting to state of a defect doped material may be beneficial in applications such as electronic switching components, memory devices, as well as other applications. Thus, in some embodiments the method 700 of FIG. 7 may be continuously and selectively applied during operation of a device. For example, after the completion of step 708 where the material transitions from the semiconducting material or conducting material to a non-conducting material, step 702 comprising applying a strain to at least a portion of the defect doped material may be repeated, followed by steps 704-708 again. The cyclic application and removal of strain may be performed any number of times and may be applied with any appropriate frequency. For example, a first strain may be applied to the defect material, followed by removal of the first strain from the defect doped material, followed by a second strain applied to the defect doped material, followed by removal of the second strain from the defect doped material, etc. In certain embodiments, the first strain, second strain, and/or any additional strains may be the same. However embodiments in which different amounts of strain are applied to a defect doped material to provide different material properties during different operating modes are also contemplated as the disclosure is not limited in this fashion.

While the above embodiment is directed to the cyclic application and removal of strains to a defect doped material, the current disclosure is not limited to only the cyclic application of strains to a defect doped material. For example, in some embodiments, the defect doped material may have a permanent or static elastic strain applied to maintain the defect doped material as a desired semiconducting material or conducting material.

The form of a defect doped material may, in some aspects, dictate how strain is applied to and/or removed from the defect doped material. According to certain embodiment, the defect doped material may have any of a variety of suitable forms (e.g., structures, sizes, and/or shapes). In some embodiments as shown in FIG. 2, a layer 200 may include a defect doped material 202. However, the defect doped material may be provided in any appropriate form including, but not limited to, a planar layer, a non-planar layer, a rod, a needle, a filament, a three-dimensional structure with one or more holes, and/or any other appropriate structure as the disclosure is not limited to the specific geometry of a material. The disclosed materials may be provided in any appropriate fashion. For instance, a defect doped material may be an epitaxial layer grown on a substrate, a standalone structure, a material that is transferred onto a substrate, and/or any other appropriate construction as the disclosure is not so limited. Several non-limiting forms of the deposited materials are discussed further below in greater detail.

In certain embodiments, at least a portion of a defect doped material may be in the form of a nanostructure (e.g., a nanowire, nanoparticle, nanosheet, nanorod, and the like). "Nanostructure" is used herein in a manner consistent with its ordinary meaning in the art. In certain embodiments, a nanostructure has a characteristic dimension, such as a layer thickness, or other appropriate dimension, that is between or equal to 1 nm and 1 micrometer. However, in other embodiments, at least a portion of the defect doped material may be in the form of a microstructure (e.g., microlayer, microwire, microparticle, microsheet, microrod, and the like). "Microscale" is used herein in a manner consistent with its ordinary meaning in the art. According to certain embodiments, a microstructure may have a characteristic dimension, such as a layer thickness, or other appropriate dimension, that is greater than or equal to 1 micrometer to less than or equal to 5 micrometers. Accordingly, in some embodiments, the disclosed materials may have a characteristic dimension that is between or equal to 1 micrometer and 2 micrometers, 10 nm and 1 micrometer, 10 nm and 500 nm, 10 nm and 100 nm, and/or any other appropriate length scale. Combinations of the above cited ranges are also possible.

In some embodiments, a characteristic dimension, such as a thickness, of a defect doped material can be measured electron microscopy techniques (e.g., scanning electron microscopy and/or transmission electron microscopy). The electron microscopy techniques can be supplemented by, for example, profilometry (e.g., optical or contact profilometers).

Having generally described the concept of applying an elastic strain to a material to alter its conductive properties, several methods for either permanently, or selectively applying these strains are described below. Generally, these methods may include both static and/or dynamic methods of applying an elastic strain to a defect doped material including, but not limited to, lattice mismatch during epitaxial growth of the material with a substrate, direct deformation of the material with an actuator or other structure, deformation of a substrate a defect doped material is disposed on, and/or any other appropriate method of applying a desired elastic strain to the material.

In one embodiment, an elastic strain may be uniformly, or non-uniformly, applied to a defect doped material. In reference to FIG. 2, for example, a compressive strain 210 may be applied to a defect doped material 202. In some instances, this may be done hydrostatically as illustrated in the figure where the same strain is applied to every external surface of the material. However, embodiments, in which non-uniform, in plane, three-dimensional, and/or any other appropriate form of elastic strain are applied to the material are also contemplated. For example, different elastic strains may be applied in different directions relative to the depicted material. This may include any desired combination of shear, tensile, compressive strains, and/or combinations of the forgoing. This may be beneficial because the band structure and defects of a material may respond differently to elastic strains applied in different crystallographic directions.

Figure 3:
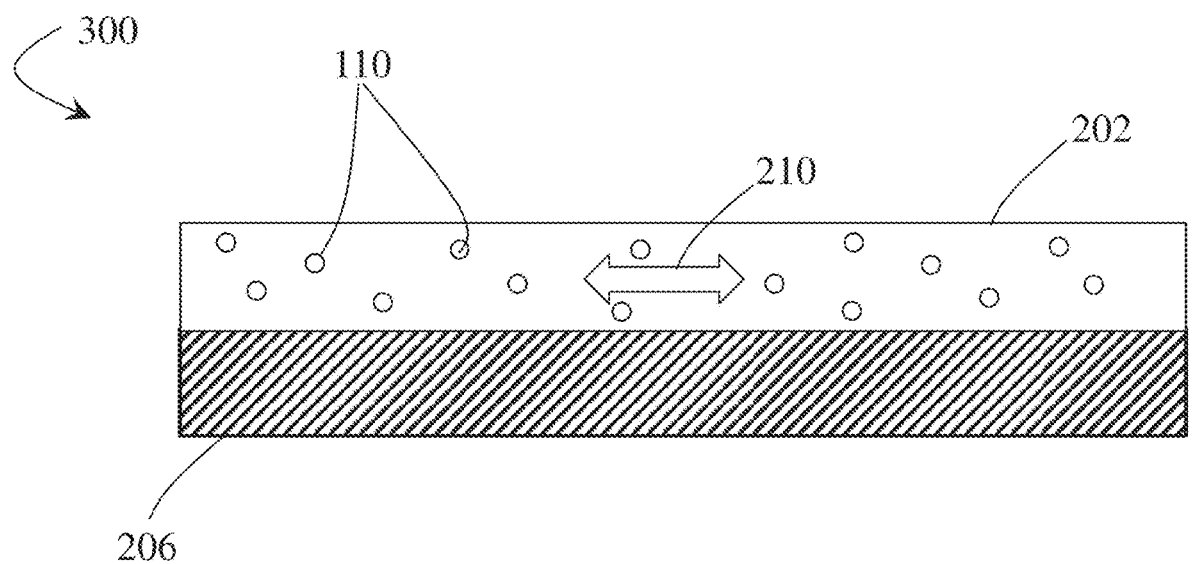
FIG. 3 is, according to some embodiments, a cross-sectional schematic representation of a non-limiting defect doped material disposed on a substrate.

As mentioned above, in some embodiments, a defect doped material may be disposed on a substrate. For example, the defect doped material may be disposed as a layer on the substrate. FIG. 3 is, according to some embodiments, a cross-sectional schematic representation of a defect doped material layer disposed on a substrate. As shown in FIG. 3, a layer 300 comprises a defect doped material 202 comprising a plurality of defects 110. In some embodiments, the defect doped material may be disposed on a substrate 206. The defect doped material may be grown on the substrate (e.g., grown on a single crystal silicon substrate). However, embodiments in which the defect doped material is separately grown and subsequently transferred onto the substrate are also contemplated. In certain embodiments, the defect doped material may be separated from a substrate by any of a variety of suitable methods (e.g., lift-off processes, etching, and/or photofabrication techniques such as UV-curable adhesives). For example, in the case of an epitaxially grown material, a strain induced in the defect doped material due to lattice mismatch between the substrate and defect doped material may result in an in plane elastic strain 210 being applied to the defect doped material as shown in the figure.

Figure 4:
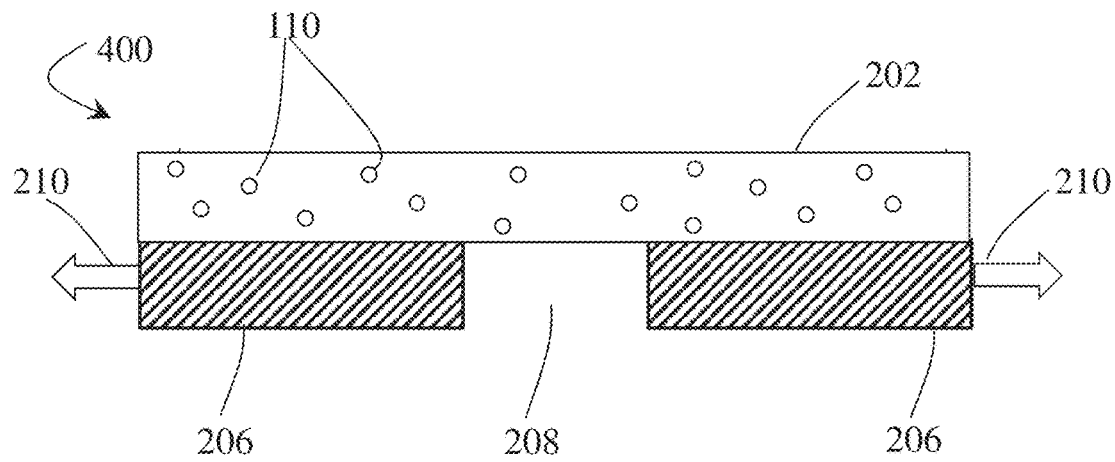
FIG. 4 is, according to some embodiments, a cross-sectional schematic representation of a non-limiting defect doped material disposed on a substrate comprising a recess.

Similar to the above, FIG. 4 depicts an embodiment of a layer 400 of defect doped material 202 including a plurality of defects 110 disposed on a substrate 206. However, in the depicted embodiment, the substrate may include a recess 208 that underlies at least a portion of the layer. The recess may be formed by any of a variety of suitable means, such as etching (e.g., circuit board etching), microelectronic machining, and/or any other appropriate method. The recess may also pass either partially, or completely, through the substrate such that the layer extends at least partially across the recess. In at least some instances, at least a portion of the layer may extend all the way across the recess. For example, the layer may extend between two electrical contacts or other structures formed on either side of the recess. A recess such as that shown in FIG. 4 may be formed for a number of reasons including electronic isolation of a corresponding portion of the defect doped material associated with the recess. To create the desired elastic strain in the defect doped material 202, a strain 210 may applied to the substrate in some embodiments. This deformation may be either statically or selectively applied to the substrate and the associated defect doped material. In instances where the strain is selectively applied, the substrate may be selectively strained using an appropriate actuator attached to the substrate, thermal expansion of the substrate, piezoelectric expansion of the substrate, and/or any other appropriate method of deforming the substrate. However, regardless of the specific manner in which the substrate is deformed, as the substrate is deformed, the layer comprising the defect doped material may be elastically strained. Of course embodiments in which the strain deformation is applied directly to both the substrate and the layer of defect doped material are also contemplated.

To aid in applying the desired elastic strains to the defect doped material noted above in reference to FIG. 4, in some embodiments, the layer of material may have one or more stress concentrations formed therein, to aid in focusing the strain in one or more desired portions of the defect doped material. For example, a series of holes, not depicted, may be formed in a layer of defect doped material to create portions of the defect doped material that are subjected to elevated stresses and strains as compared to other portions of the defect doped material.

To facilitate the above noted deformation of a substrate, in some embodiments, a substrate may be made from a material that exhibits a desired amount of elasticity to accommodate applying the elastic strains to the associated defect doped material. For example, in certain embodiments, the substrate may comprise a polymer such as polydimethylsiloxane (PMDS), polymethyl methacrylate (PMMA), polycarbonate (PC), poly(ethylene glycol) diacrylate (PEGDA) polystyrene (PS), polyurethane (PU), and/or combinations thereof. However, in other embodiments, the substrate may comprise conventional substrate materials such as metal oxide (e.g., an aluminum oxide such as sapphire, zinc oxide, magnesium oxide and/or combinations thereof), silicon (e.g., elemental silicon, silicon dioxide, silicon carbide and/or combinations thereof), and/or any other appropriate substrate material.

Figure 5:
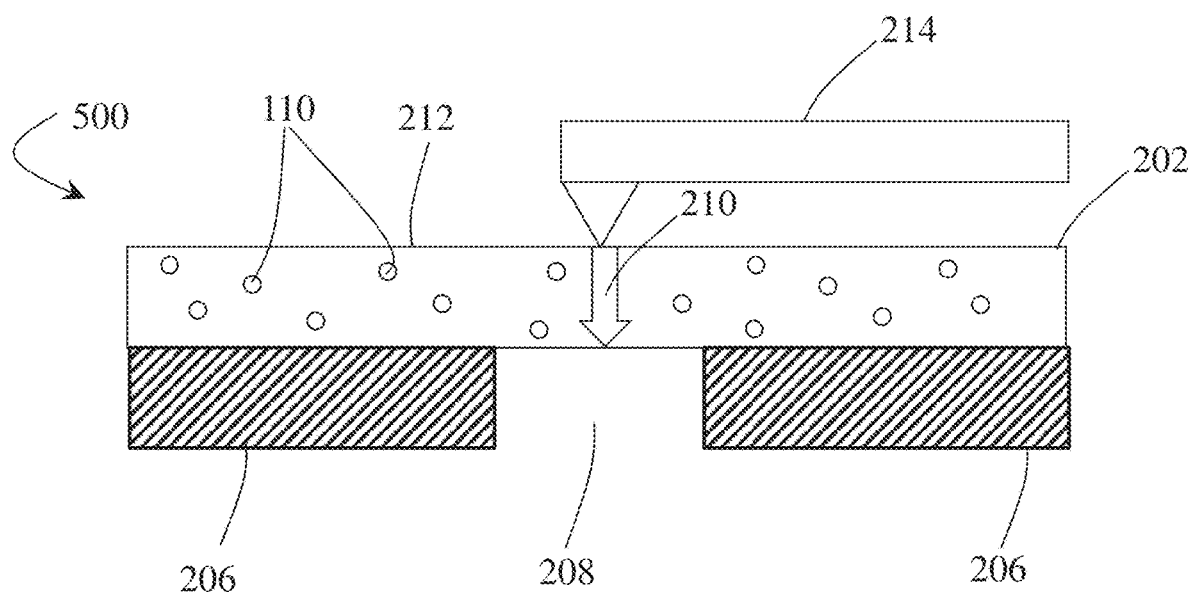
FIG. 5 is, according to some embodiments, a cross-sectional schematic representation of a non-limiting actuator and defect doped material disposed on a substrate.

In some embodiments a strain may be mechanically and/or dynamically applied directly to a defect doped material. For example, in some embodiments, an elastic strain may be applied by deforming a defect doped material with an actuator. FIG. 5 shows one such embodiment where an actuator 214 is operatively associated with a defect doped material 202 disposed on a substrate 206. As shown in FIG. 5, layer 500 comprises the defect doped material 202 with a plurality of defects 110. The actuator 214 is in contact with a portion of the layer overlying a recess 208 formed in the substrate. In certain embodiments, the actuator is a microelectromechanical (MEM) actuator. However, regardless of the specific construction of the actuator, the actuator may be configured to selectively strain the defect doped material. For example, as shown in the figure, the actuator may be configured to selectively apply a downwardly oriented strain 210 to a top surface 212 of the defect doped material located opposite the substrate and overlying the recess. In some aspects, the actuator may be configured to selectively apply and remove the strain from the defect doped material in a cyclic fashion as described above. For example, in some such embodiments, the actuator may be configured to selectively strain the defect doped material to at least a first strain. Additionally, the actuator may also be configured to remove the first strain from the defect doped material, followed by an application of a second strain which may be greater than, equal to, or less than the first strain.

While a particular construction of an actuator for applying a strain to a layer of defect doped material has been illustrated in figures, it should be understood that the current disclosure is not limited to only this particular embodiment. For example, different types of actuators and material layers with different geometries may be used as the disclosure is not limited to this specific geometry and arrangement.

Figure 6:
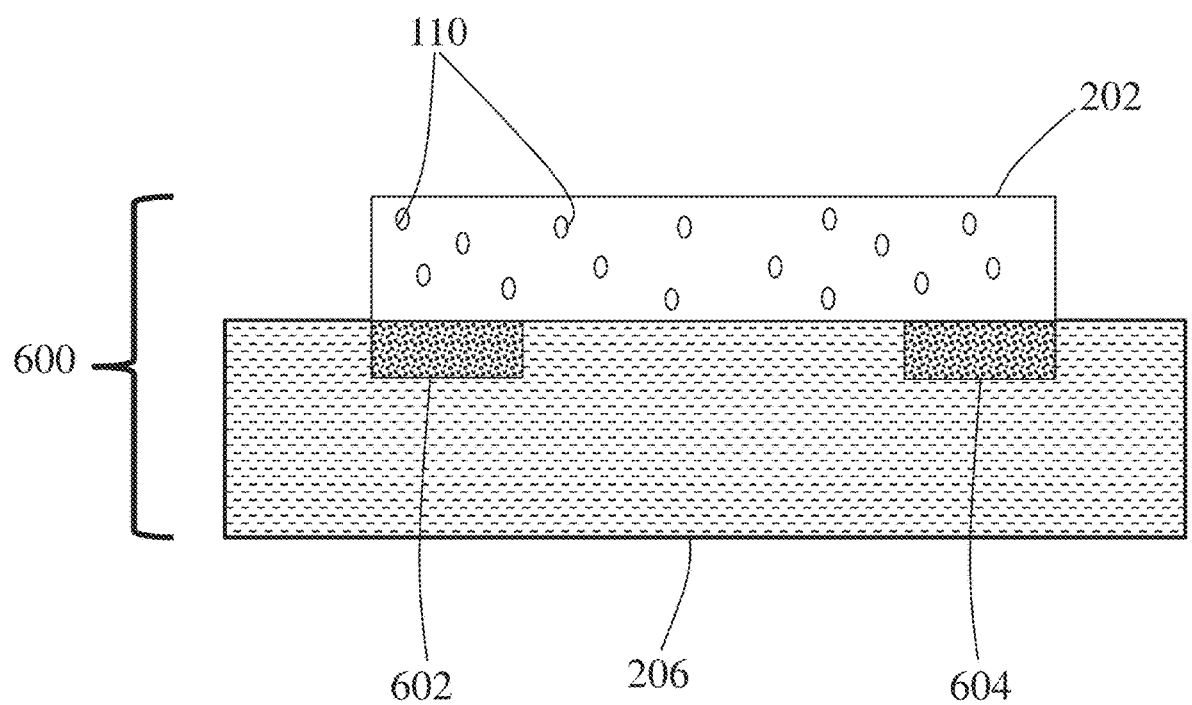
FIG. 6 is, according to some embodiments, a cross-sectional schematic representation of a non-limiting defect doped material forming at least a portion of a circuit.

As explained herein, using strain to either statically and/or selectively control a defect doped material to have either a shallow doping level and/or a deep doping level permits the creation of charge carriers in the defect doped material. As a result, these defect doped materials have the ability to transition from a non-conducting material when in the unstrained state to a semiconducting or a conducting material when in the elastically strained state. Accordingly, in some aspects, the defect doped materials disclosed herein may be beneficial for use in forming at least a portion of a circuit. FIG. 6 is, according to some embodiments, a cross-sectional schematic representation of a non-limiting defect doped material forming at least a portion of a circuit. As shown in the figure, a circuit 600 comprises a component made from a defect doped material 202 comprising a plurality of defects 110. The defect doped material may be disposed on a substrate 206. In some embodiments, the defect doped material may be connected to one or more electrical contacts (e.g., contact pads) 602, or other appropriate component of the electrical circuit. Other components of the circuit that the component made from the defect of material may be electrically associated with may include, but are not limited to, additional layers (e.g., passivation layer, metal layers), resistors, capacitors, transistors, inductors, and the like.

In view of the above, the compositions described herein comprising an elastically strained defect doped material may be used in a variety of suitable semi-conductor devices including, for example, photonic devices, optoelectronic devices, high speed electronic devices, spintronic devices, photovoltaic devices, light-emitting devices (e.g., light-emitting diodes or LEDs), and the like. According to some embodiments, the defect doped material may be used as a memory device. As described herein, for example, a defect doped material may be dynamically toggled to permit or prevent the ionization of the defects to form charge carriers due to the selective application of an elastic strain. Thus, the defect doped material may be incorporated into a memory device due to the ability to cyclically toggle between one or more localized electronic states of the defect and one or more excited electronic states. In such a memory device, the writing may comprise applying strain, and the readout may comprise an electrical and/or optical readout of the conductive state of the elastically strained material.

The following examples are intended to illustrate certain embodiments of the present disclosure, but do not exemplify the full scope of the disclosure.

Example 1

The following example describes applying strain to a defect doped material comprising diamond.

Figure 8:
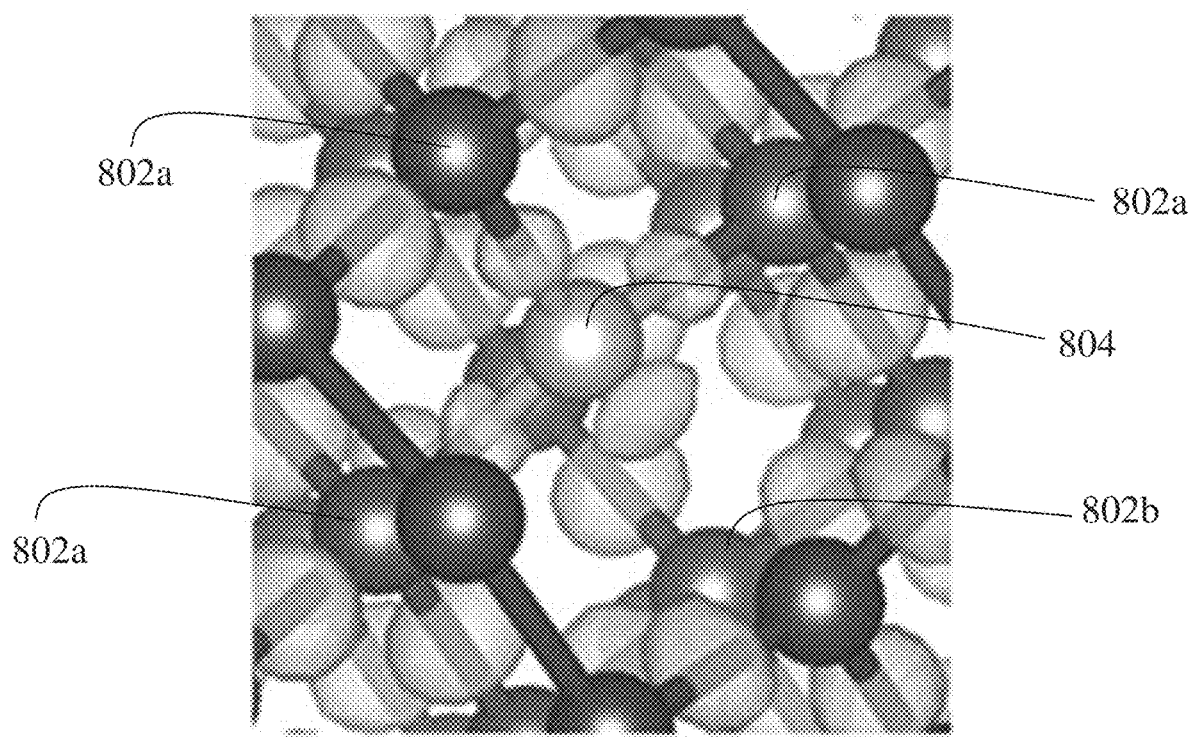
FIG. 8 is, according to some embodiments, an exemplary drawing of the breaking of tetrahedral symmetry in diamond comprising a nitrogen defect.

The application of diamond as a semiconducting material or a conducting material has historically been impeded by the difficulty to electron-dope (e.g., n-type doping) the material. The nitrogen point defect ($N_C$) is bound to four carbon atoms (C-atoms) and has tetrahedral symmetry. There exists, however, a spontaneous symmetry breaking of the tetrahedral symmetry to one of four equivalent low-symmetry variants ($N_1$-$N_4$). In each symmetry variant, the nitrogen atom (N-atom) breaks a bond with one of the four C-atoms it is bound to, and forms shorter bonds with the other three C-atoms. A schematic of a low symmetry variant is shown in FIG. 8, wherein N-atom 804 is bound to three C-atoms 802a, but there is no bond between N-atom 804 and C-atom 802b. As a result, the nitrogen point defect is in a deep donor state that is more than 1 eV below the conduction band edge. In such an energetic state, the nitrogen point defect is impossible to ionize by room-temperature thermal fluctuations and therefore will not contribute charge carriers to the conduction band.

Figure 9:
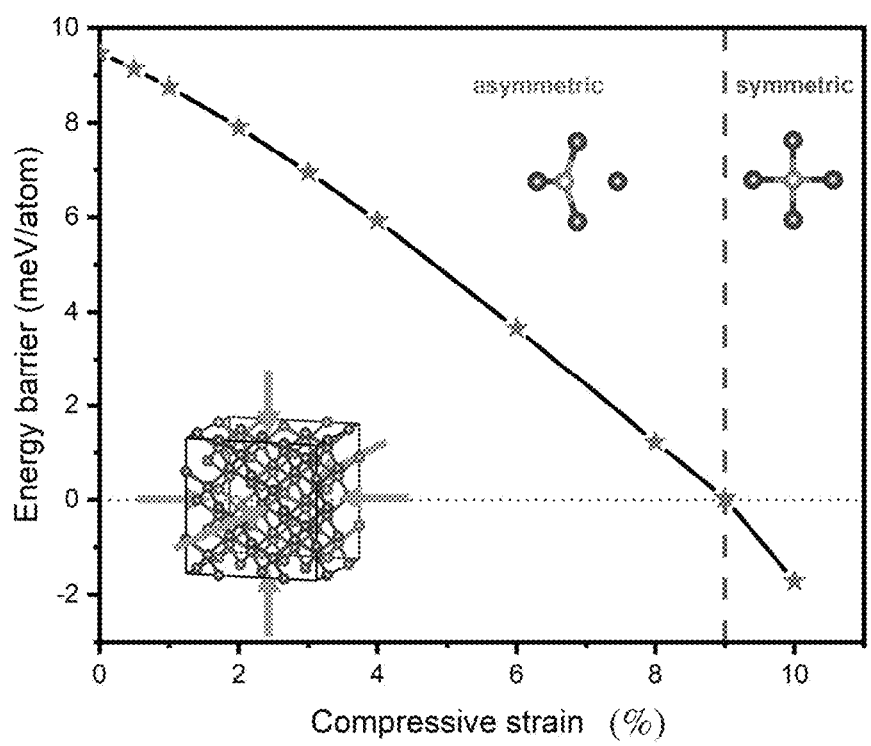
FIG. 9 is, according to some embodiments, a graph of an energy barrier as a function of strain.
Figure 10:
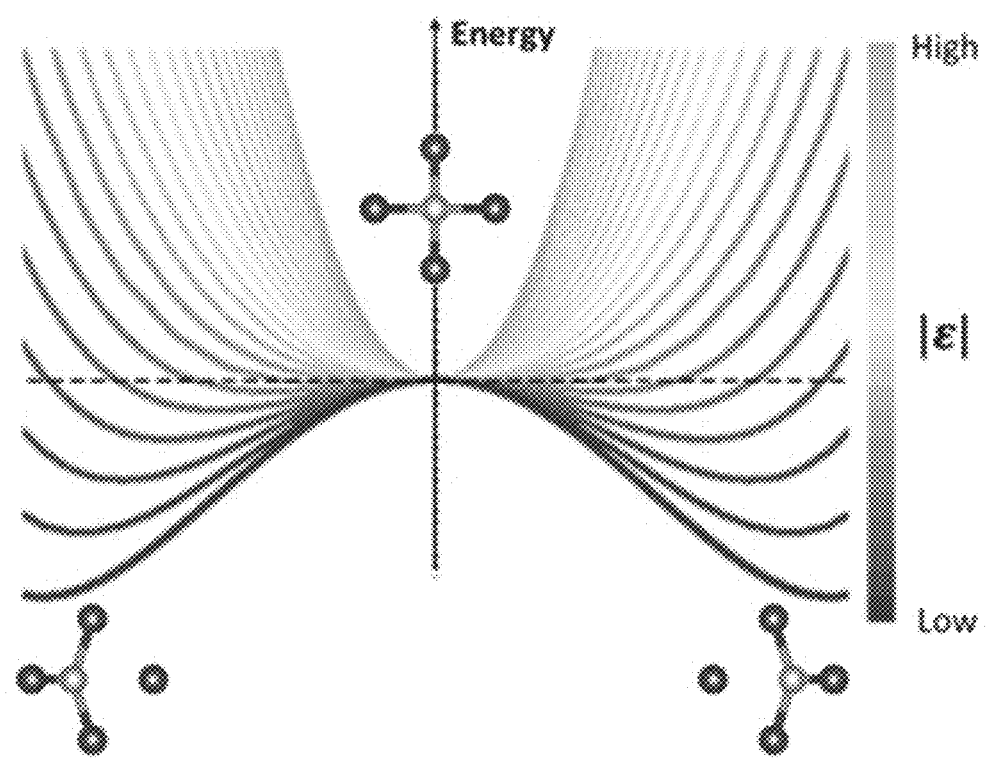
FIG. 10 is, according to some embodiments, a plot of the strain gradient from an asymmetrical orientation to a symmetrical orientation for diamond comprising a nitrogen defect.

In compressing when the diamond is elastically strained by as much as 10%, the $N_1$-$N_4$ low symmetry variants are converted to $N_C$ (Table 1) FIG. 9 shows, according to certain embodiments, a graph of the energy barrier as a function of strain. As strain is applied to the nitrogen doped diamond, the N-atom gradually moves to the center of the tetrahedral site bounded by four other C-atoms, until the crystal is symmetric. This process is shown in FIG. 10, which is a plot of the strain gradient from an asymmetrical orientation to a symmetrical orientation for nitrogen doped diamond, according to some embodiments. The application of a 10% compressive strain creates a high symmetry, shallow donor state that readily contributes delocalized electron carriers to the conduction band by thermal ionization. Furthermore, applying a compressive strain of 10% turns the energy barrier negative, which indicates the symmetric, tetrahedral structure is energetically stable. Applying a compressive strain to a region of diamond comprising a nitrogen point defect can therefore provide a transition from a deep dopant state to shallow, n-type dopant state.

TABLE 1

Energy barrier decrease as strain is applied.

| Compressive strain (-%) | Energy barrier (meV/atom) |
|---|---|
| 0 | 9.465 |
| 0.5 | 9.141 |
| 1 | 8.752 |
| 2 | 7.907 |
| 3 | 6.940 |
| 4 | 5.931 |
| 6 | 3.664 |

TABLE 1-continued

Energy barrier decrease as strain is applied.

| Compressive strain (-%) | Energy barrier (meV/atom) |
|---|---|
| 8 | 1.228 |
| 9 | 0 |
| 10 | −1.713 |

What is claimed is:

1. A method of controlling a conductive state of a defect doped material, the method comprising:
 applying a strain to at least a portion of the defect doped material; and
 transitioning the defect doped material from a non-conductive material to a semiconducting material or a conducting material, wherein an activation energy to ionize defects of the defect doped material in a strained state is less than the activation energy to ionize the defects when the defect doped material is in an unstrained state.

2. The method of claim 1, wherein transitioning the defect doped material from the non-conductive material to the semiconducting material or the conducting material comprises decreasing the activation energy to ionize the defects of the defect doped material to form a plurality of charge carriers from a first energy that is greater than or equal to 1,000 meV to a second energy that is less than or equal to 200 meV.

3. The method of claim 1, wherein the strain is elastic strain.

4. The method of claim 1, wherein the strain is applied in an amount between or equal to 1% and 20%.

5. The method of claim 1, wherein the strain is uniformly applied to the defect doped material.

6. The method of claim 1, wherein the strain is only applied to a portion of the defect doped material.

7. The method of claim 1, wherein applying the strain includes deforming the defect doped material with an actuator.

8. The method of claim 7, wherein the actuator is a microelectromechanical actuator.

9. The method of claim 1, wherein applying the strain includes deforming a substrate the defect doped material is disposed on.

10. The method of claim 1, wherein the defect doped material comprises a p-type dopant.

11. The method of claim 1, wherein the defect doped material comprises a n-type dopant.

12. The method of claim 1, further comprising removing the strain from the at least a portion of the defect doped material.

13. The method of claim 12, further comprising transitioning the defect doped material from the semiconducting material or the conducting material to the non-conductive material.

14. The method of claim 13, wherein transitioning the defect doped material from the semiconducting material or the conducting material comprises increasing the activation energy from a second energy that is less than or equal to 200 meV to a first energy that is greater than or equal to 1,000 meV.

15. A method of controlling a conductive state of a portion of an electrical circuit, the method comprising:
 applying a strain to a defect doped material forming at least a portion of the electrical circuit; and
 transitioning the defect doped material from a non-conductive material to a semiconducting material or a conducting material, wherein an activation energy to ionize defects of the defect doped material in a strained state is less than the activation energy to ionize the defects when the defect doped material is in an unstrained state.

16. The method of claim 15, wherein transitioning the defect doped material from the non-conductive material to the semiconducting material or the conducting material comprises decreasing the activation energy to ionize defects of the defect doped material to form a plurality of charge carriers from a first energy that is greater than or equal to 1,000 meV to a second energy that is less than or equal to 200 meV.

17. The method of claim 15, wherein the defect doped material comprises at least one selected from the group of diamond, gallium oxide, gallium nitride, and boron nitride.

18. The method of claim 15, wherein the defect doped material comprises nitrogen, boron, and/or phosphorus.

19. The method of claim 15, wherein the defect doped material comprises a p-type dopant and/or an n-type dopant.

20. The method of claim 15, further comprising applying the strain to the defect doped material with an actuator.

* * * * *